US008962473B2

(12) United States Patent
Kuo et al.

(10) Patent No.: US 8,962,473 B2
(45) Date of Patent: Feb. 24, 2015

(54) METHOD OF FORMING HYBRID DIFFUSION BARRIER LAYER AND SEMICONDUCTOR DEVICE THEREOF

(71) Applicant: Taiwan Semiconductor Manufacturing Co., Ltd., Hsin-Chu (TW)

(72) Inventors: Kai-Shiang Kuo, Hsinchu (TW); Ken-Yu Chang, Hsinchu (TW); Ya-Lien Lee, Baoshan Township (TW); Hung-Wen Su, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/833,794

(22) Filed: Mar. 15, 2013

(65) Prior Publication Data

US 2014/0264867 A1    Sep. 18, 2014

(51) Int. Cl.
*H01L 21/768* (2006.01)
*H01L 23/532* (2006.01)

(52) U.S. Cl.
CPC ........ *H01L 23/53238* (2013.01); *H01L 21/768* (2013.01); *H01L 21/76843* (2013.01)
USPC ........... 438/627; 438/643; 438/653; 257/751; 257/E21.585; 257/E23.16; 257/E23.161; 257/E23.145; 257/E23.154

(58) Field of Classification Search
CPC ................... H01L 21/76843; H01L 23/53238
USPC ................. 438/627, 628, 643, 644, 653, 654; 257/751, E21.585, E23.145, E23.154, 257/E23.16, E23.161
See application file for complete search history.

(56) References Cited

U.S. PATENT DOCUMENTS

| | | | |
|---|---|---|---|
| 6,482,733 B2* | 11/2002 | Raaijmakers et al. | 438/633 |
| 6,686,271 B2* | 2/2004 | Raaijmakers et al. | 438/633 |
| 6,699,783 B2* | 3/2004 | Raaijmakers et al. | 438/633 |
| 6,759,325 B2* | 7/2004 | Raaijmakers et al. | 438/633 |
| 7,211,507 B2 | 5/2007 | Dunn et al | |
| 7,605,471 B2 | 10/2009 | Lee | |
| 8,148,270 B2 | 4/2012 | Tao et al. | |
| 8,338,951 B2 | 12/2012 | Jung et al. | |
| 8,623,761 B2* | 1/2014 | Bonilla et al. | 438/653 |
| 2004/0229457 A1 | 11/2004 | Chan et al. | |

(Continued)

FOREIGN PATENT DOCUMENTS

KR    10-2009-0045287    5/2009
WO    2008027205 A2    3/2008

OTHER PUBLICATIONS

Tan, J.J. et al., "Investigation of Ru/TaN on low dielectric constant material with k=2.7", International Conference on Solid-State and Integrated Circuit Technology—ICSICT, 2008, 3 pages.

(Continued)

*Primary Examiner* — Mary Wilczewski
(74) *Attorney, Agent, or Firm* — Duane Morris LLP

(57) ABSTRACT

In a method of fabricating a semiconductor device, an opening is formed inside a dielectric layer above a semiconductor substrate. The opening has a wall. At least one diffusion barrier material is then formed over the wall of the opening by at least two alternating steps, which are selected from the group consisting of a process of physical vapor deposition (PVD) and a process of atomic layer deposition (ALD). A liner layer is formed over the at least one diffusion barrier material.

19 Claims, 7 Drawing Sheets

(56) References Cited

U.S. PATENT DOCUMENTS

| | | |
|---|---|---|
| 2006/0148253 A1 | 7/2006 | Chung et al. |
| 2007/0040275 A1* | 2/2007 | Lee et al. ............ 257/751 |
| 2012/0292768 A1 | 11/2012 | Chang et al. |
| 2012/0319278 A1 | 12/2012 | Lin et al. |

OTHER PUBLICATIONS

Yang, C.C. et al., "Physical, Electrical, and Reliability Characterization of Ru for Cu Interconnects", 2006 International Interconnect Technology Conference, Jun. 2006, pp. 187-190.

Yang, C.C. et al., "Low-Temperature Reflow Anneals of Cu on Ru", IEEE Electron Device Letters, Jun. 2011, 32 (6):806-808.

Khan, M. et al., "Damascene Process and Chemical Mechanical Planarization", 2011, retrieved from www.ece.umd.edu/class/enee416/GroupActivities/Damascene, 13 pages.

Kim, H. et al., "Robust TaNx Diffusion Barrier for Cu Interconnect Technology with Sub-Nanometer Thickness by Metal Organic Plasma-Enhanced Atomic Layer Deposition", J. Appl. Phys., 2005, 98(1), 2 pages.

Burton, B.B. et al., "Tantalum Nitride Atomic Layer Deposition Using (tert-Butylimido)tris(diethylannido)tantalum and Hydrazine", Journal of the Electrochemical Society, 2008, 155(7):D508-D516.

Official Action issued Jul. 22, 2014, in counterpart KR patent application No. 10-2013-0088726.

Official Action issued Dec. 17, 2014, in counterpart KR patent application No. 10-2013-0088726.

* cited by examiner

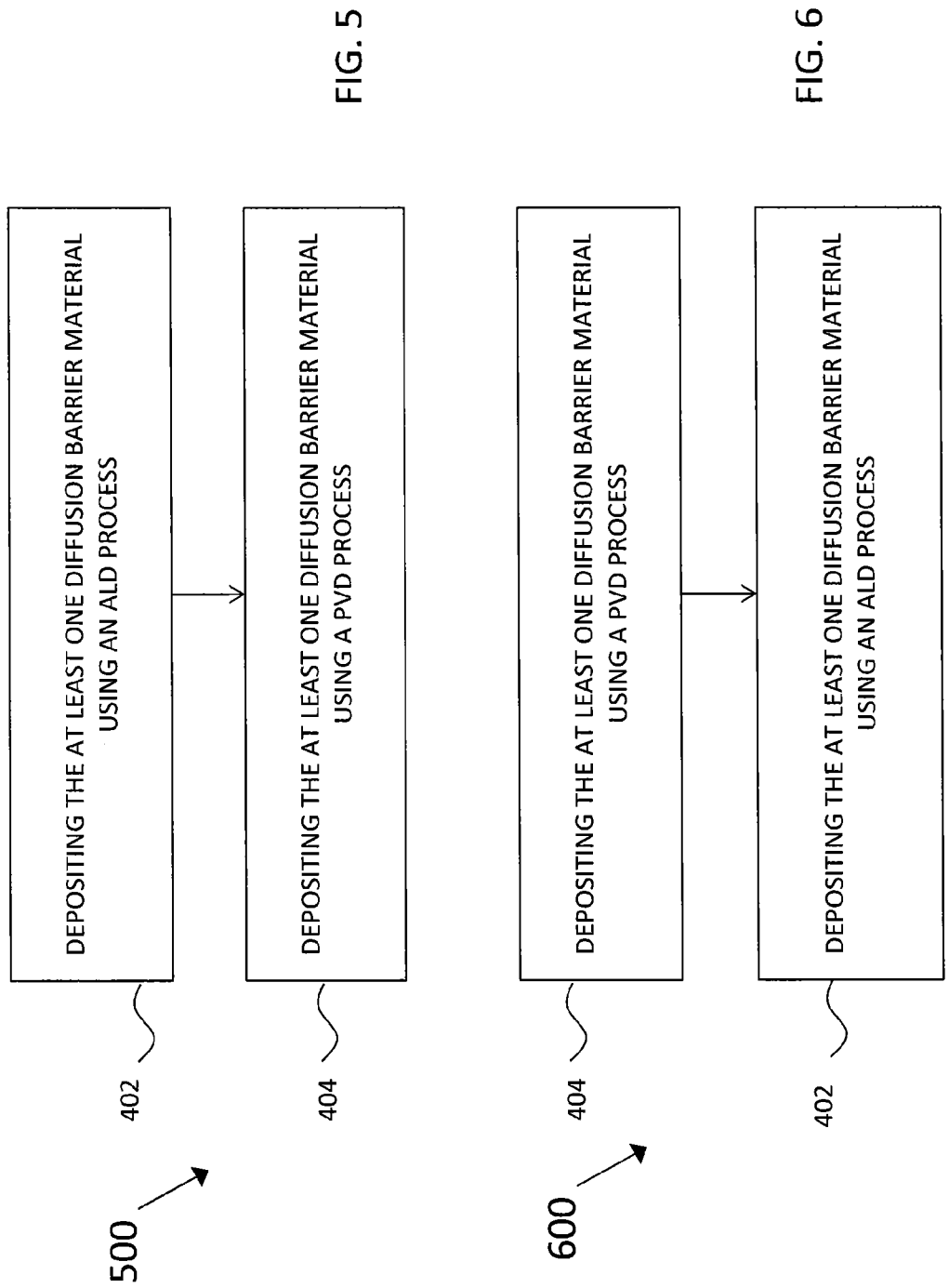

METHOD OF FORMING HYBRID DIFFUSION BARRIER LAYER AND SEMICONDUCTOR DEVICE THEREOF

FIELD

This disclosure relates to semiconductors. More particularly, the disclosed subject matter relates to a method for forming a diffusion barrier in a semiconductor interconnect structure, and a resulting semiconductor device comprising such a diffusion barrier.

BACKGROUND

Interconnect structures comprising metallization lines connect various components of semiconductor integrated circuits (ICs) both within each layer and in different layers. The metallization lines within each layer are formed in an interlayer dielectric (ILD) material. The ILD material electrically isolates metallization lines from one another within each level and in adjacent levels of interconnect structures. Damascene processes including single damascene process and dual-damascene process are routinely used for fabricating multi-level interconnect structures. In a damascene process, trenches and via holes are made inside and through an ILD layer, and filled with a conductive material, such as copper (Cu) or a Cu-based alloy, to create metallization lines and vertical conductive paths (vias) between adjacent layers.

Copper or copper-based alloy is used in metallization lines of semiconductor interconnect structures because of its higher electrical conductivity and higher resistance to electromigration compared to aluminum. However, copper may diffuse through an ILD layer and a semiconductor substrate to cause device reliability issues or poison transistors in a semiconductor IC device. As ICs and semiconductor devices get smaller, the size of interconnect structures also decreases. To prevent copper diffusion becomes increasingly important to improve reliability of semiconductor devices.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

FIGS. 4-6 are flow chart diagrams illustrating three exemplary processes of forming at least one diffusion barrier material over a wall of an opening in a dielectric layer by at least two alternating steps in accordance with some embodiments.

DETAILED DESCRIPTION

Figure 1A:
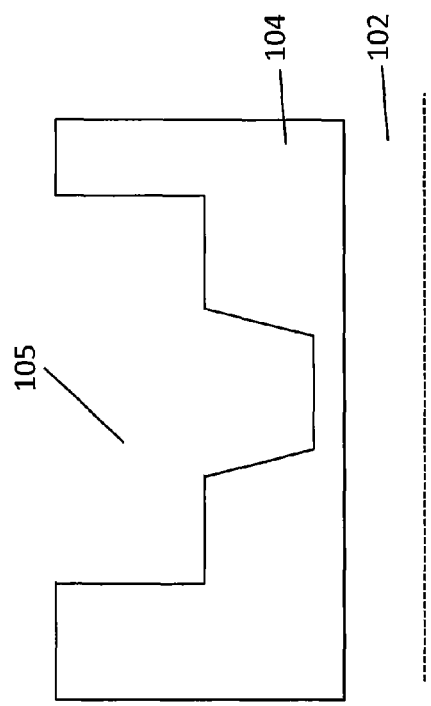
FIGS. 1A-1F are cross-sectional views of a portion of a semiconductor device during fabrication, illustrating an exemplary process of forming a semiconductor device in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Semiconductor devices such as CMOS devices continue to be scaled to smaller size to meet advanced performance specifications. Fabrication of devices with such small dimensions involves precise controls. In some embodiments, a diffusion barrier material such as tantalum (Ta) or tantalum nitride (TaN) inside a damascene via are used to mitigate diffusion of copper in metallization lines of semiconductor interconnect structures. In some embodiments, a liner material such as ruthenium (Ru) is used between a conductive layer comprising copper and the diffusion barrier layer. The diffusion barrier material and the liner material are made through a process of physical vapor deposition (PVD). However, some defects such as non-uniformity or voids could be found in either the diffusion barrier material or the liner material. Such defects may result in poor reliability of a resulting semiconductor device. In some embodiments, the structures of both the diffusion barrier material and the liner material are to be tailored to further mitigate or prevent diffusion of copper in the conductive material.

Some embodiments provide a method of fabricating a semiconductor device and a resulting semiconductor device. Such a method comprises forming at least one diffusion barrier material over a wall of an opening in a dielectric layer, through at least two alternating steps. Examples of the opening in a dielectric layer include but are not limited to trenches, damascene via and via holes. Examples of the at least two alternating steps include but are not limited to a process of physical vapor deposition (PVD) and a process of atomic layer deposition (ALD). The method results in a semiconductor device having void-free and defect-free metallization lines filled inside an opening in a dielectric layer.

In FIGS. 1A-1F, like items are indicated by like reference numerals, and for brevity, descriptions of the structure, provided above with reference to the previous figures, are not repeated. The method described in FIG. 3 is described with reference to the exemplary structures described in FIGS. 1A-1F.

Figure 3:
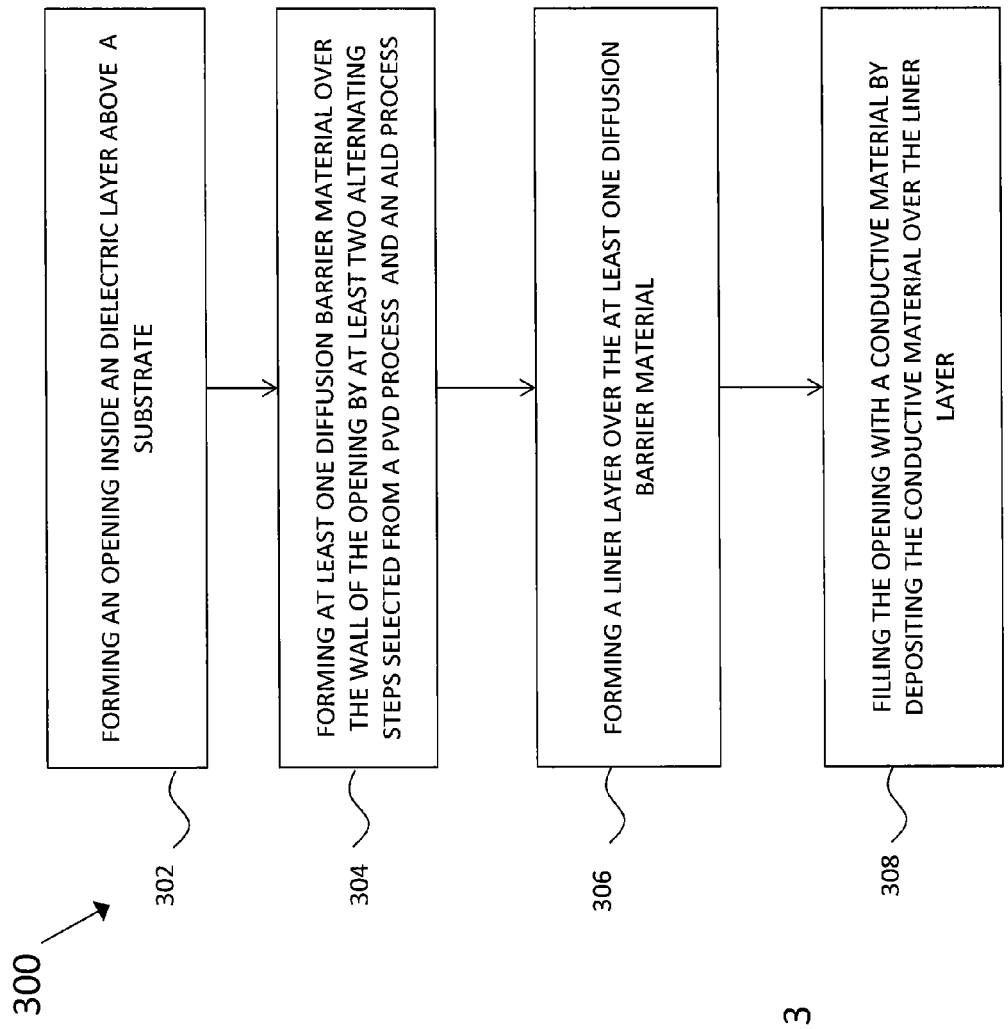
FIG. 3 is a flow chart diagrams illustrating an exemplary process of forming a semiconductor device in accordance with some embodiments.

FIG. 3 is a flow chart diagram illustrating an exemplary process 300 of forming a semiconductor device 100 in accordance with some embodiments. FIGS. 1A-1F illustrate a portion of semiconductor device 100 in a respective fabrication step.

Referring to FIG. 3, before step 302, a dielectric layer 104 is formed above a semiconductor substrate 102. Semiconductor substrate 102 can be a wafer comprising a semiconductor material. Examples of suitable materials for semiconductor substrate 102 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. Dielectric layer 104 comprises a material having relatively low dielectric constant in some embodiments. Examples of suitable materials for dielectric layer 104 include but are not limited to silicon oxide, silicon oxynitride, phosphosilicate galss (PSG), borophosphosilicate glass (BPSG), combinations thereof, or other suitable material. In some embodiments, dielectric layer 104 is silicon dioxide. Dielectric layer 104 can be formed by using CVD, high density plasma CVD, spin-on, sputtering, or other suitable method.

At step 302 of FIG. 3, an opening 105 is formed inside dielectric layer 104 above semiconductor substrate 102. Opening 105 has a wall. The wall or wall profile of opening 105 comprises at least one bottom wall and a side wall in some embodiments. Opening 105 can be a trench, or damascene via hole, or any other suitable structures or a combination thereof. The structure of a portion of an exemplary semiconductor device after step 302 is illustrated in FIG. 1A. FIG. 1A is for illustration purpose only. In some embodiments, either substrate 102 or the portion of dielectric layer 104 below opening 105 comprises at least one conductive layer or feature (not shown). Opening 105 is disposed over the at least one conductive layer or feature below. For example, referring to FIG. 2, the at least one conductive layer or feature below can be a conductive material 114 over a diffusion barrier material 120.

At step 304, at least one diffusion barrier material 109 is formed over the wall of opening 105 by at least two alternating steps. The at least two alternating steps are selected from the group consisting of a PVD process and an ALD process in some embodiments. Examples of a suitable diffusion barrier material 109 include but are not limited to Ta, TaN, TaN/Ta, TiN, TiSiN, W, TiW, or WN. The diffusion barrier layer comprises tantalum nitride in some embodiments. Diffusion barrier material 109 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. In each of the at least two alternating steps of step 304, the at least one diffusion barrier material 109 is deposited in a thickness in the range of about angstroms 5 to about 30 angstroms, for example, in the range of from about 10 angstroms to about 20 angstroms in some embodiments.

Figure 4:
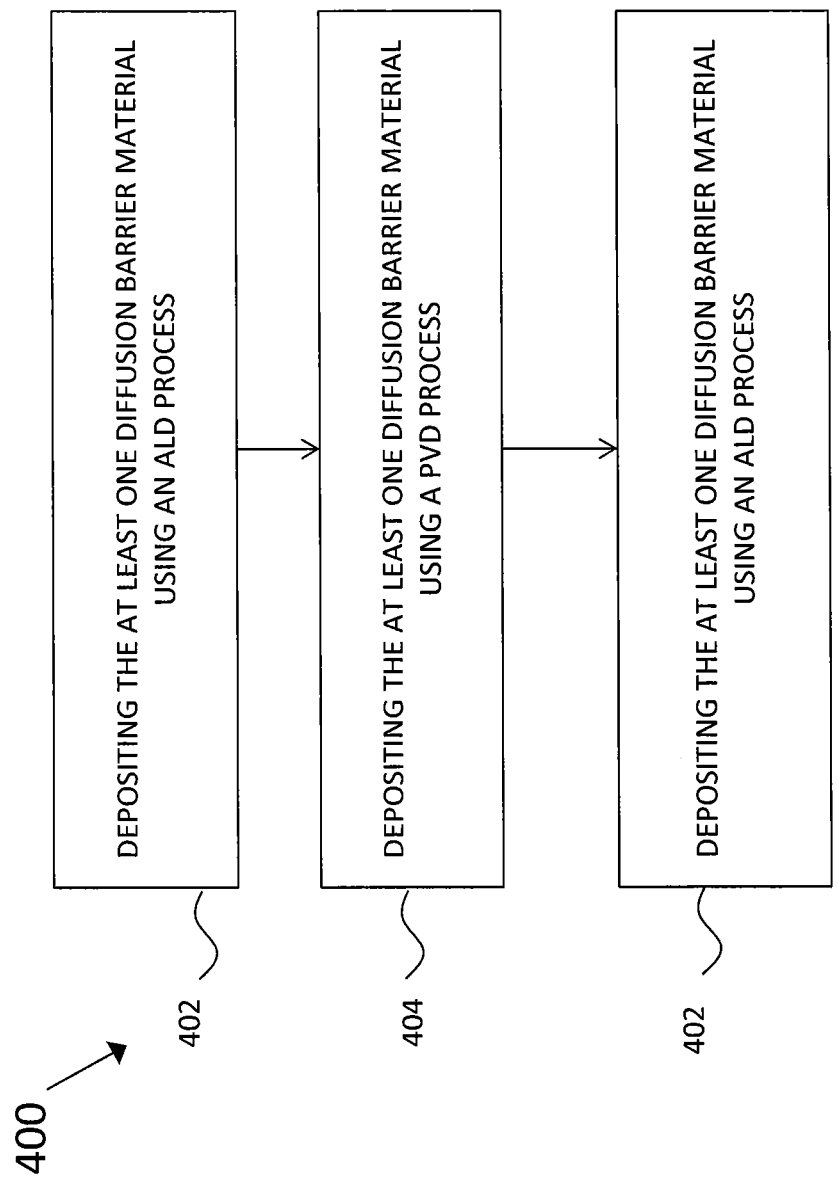

FIGS. 4-6 are flow chart diagrams illustrating three exemplary processes of forming at least one diffusion barrier material 109 over a wall of an opening 105 in a dielectric layer 104 by at least two alternating steps in accordance with some embodiments.

Figure 1B:
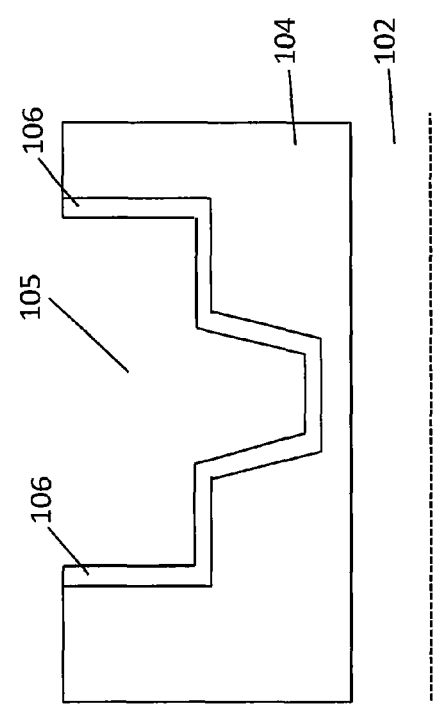
Figure 1C:
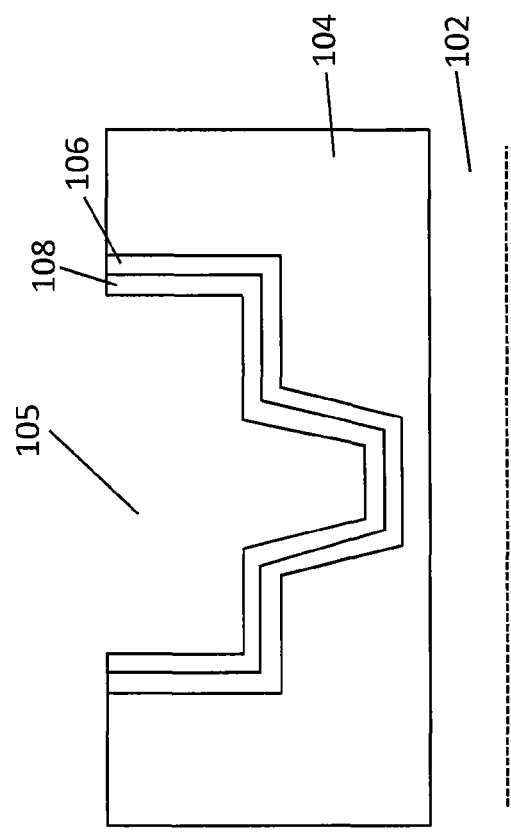
Figure 1D:
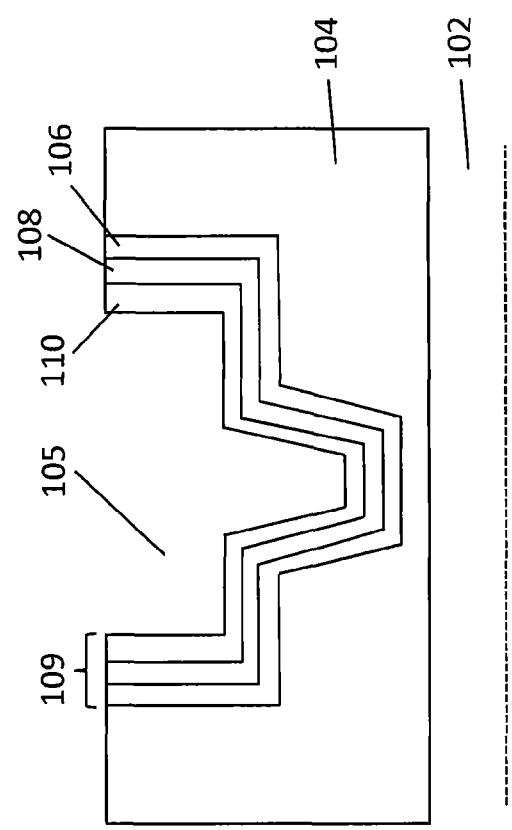

Referring to FIG. 4, in some embodiments, step 304 of depositing the at least one diffusion barrier material 109 comprises, in the following sequence: step 402, 404 and 402 as illustrated in the exemplary method 400. The at least one diffusion barrier material or the diffusion barrier layer 109 comprises three layers of diffusion barrier material 106, 108 and 110 as shown in FIGS. 1B-1D.

At step 402, the at least one diffusion barrier material 106 is deposited over the wall of opening 105 using an ALD process. The resulting structure of the semiconductor device after step 402 is illustrated in FIG. 1B. Atomic layer deposition (ALD) is based on a binary chemical vapor deposition (CVD) reaction between two reactants introduced into a semiconductor processing chamber sequentially. The self-limiting surface reaction yields molecular or atomic layers of a film in a controlled and conformal manner.

In some embodiments, diffusion barrier material 106 comprises tantalum nitride in a thickness in the range of from about 5 angstroms to about 30 angstroms, for example, from about 10 angstroms to about 20 angstroms. Diffusion barrier material 106 comprising tantalum nitride can be made through an ALD or plasma-enhanced ALD (PEALD) by sequential introducing a tantalum precursor and a nitrogen precursor in either a gas or liquid form. Examples of a tantalum precursor include but are not limited to $TaCl_5$, $TaCl_5$, tantalum pentakis (dimethylamino) tantalum (PDMAT) (Ta$(NCH_3)_2)_5$), pentakis (ethylmethylamino) tantalum, (tertbutylimido) tris (ethylmethylamino) tantalum, and (tert-butylimido) tris (diethylamido) tantalum (TBTDET), any other inorganic or organometallic tantalum, and any combination thereof. Examples of a nitrogen precursor include but are not limited to ammonia gas, organic amines such as allylamine and tert-butylamine, hydrazine, other suitable nitrogen-containing compounds, and any combination thereof. In some embodiments, the precursor used is PDMAT. A tantalum precursor can comprise tantalum (V), which is reduced to tantalum (III) in tantalum nitride under a plasma condition. The ALD process can be performed in a vacuum chamber at a temperature in the range of 100-500° C. For example, in an exemplary process, the vacuum pressure is 3.5 torr and the temperature is 275° C.

The resulting diffusion barrier material 106 comprising tantalum nitride from an ALD process can be according to a formula of TaNx, wherein x is a number in the range of from 0.5 to 1.5. In some embodiments, tantalum nitride in diffusion barrier material 106 has an atomic ratio of tantalum (Ta) to nitrogen (N) of substantially 1:1. In some other embodiments, tantalum nitride is nitrogen-enriched. The value of x is in the range of from 1 to 1.5 in some embodiments. Examples of such TaNx include but are not limited to $Ta_3N_5$, $Ta_4N_5$ and $Ta_5N_6$.

At step 404 of FIG. 4, one diffusion barrier material 108 is then deposited over diffusion barrier material 106 using a PVD process. The resulting structure of the exemplary semiconductor device after step 404 is shown in FIG. 1C. In some embodiments, diffusion barrier material 108 is made by a suitable PVD process such as ion sputtering in a vacuum chamber. For example, tantalum nitride can be form by sputtering a target comprising Ta in nitrogen. In some embodiments, diffusion barrier material 108 comprises tantalum nitride in a thickness in the range of from about 5 angstroms to about 30 angstroms (Å), for example, from about 10 angstroms to about 20 angstroms. In some embodiments, tantalum nitride in diffusion barrier material 108 has an atomic ratio of tantalum (Ta) to nitrogen (N) is substantially 1:1.

After step 404, exemplary method 400 can comprises another step 402 to deposit a diffusion barrier material 110 over the diffusion barrier material 108, using an ALD process. The resulting structure of the exemplary semiconductor device after the repeated step 402 is shown in FIG. 1D. The depositing process and resulting structure of diffusion barrier material 110 can be the same as those of diffusion barrier material 106 as described.

In some embodiments, the step of depositing the at least one diffusion barrier material 109 comprises two steps. For example, as shown in FIG. 5, in some embodiments, an exemplary method 500 comprises: step 402 of depositing at least one diffusion barrier material 109 using an ALD process, followed by step 404 of depositing the at least one diffusion barrier material 109 using a PVD process. Similarly, as shown in FIG. 6, in some other embodiments, an exemplary method 600 comprises step 404 of depositing at least one diffusion barrier material 109 using a PVD process; and then step 402 of depositing the at least one diffusion barrier material 109 using an ALD process. The resulting structures (not shown) using the exemplary methods 500 and 600 are similar to that illustrated in FIG. 1D, except that the at least one diffusion barrier material 109 includes two rather than three layers.

The number of the layers of the at least one diffusion barrier material or the diffusion barrier layer 109 are not limited to two or three. The total number of the alternating layers for the diffusion barrier material 109 can be more than three in some embodiments. The total thickness of diffusion barrier layer 109 is less than 45 angstroms in some embodiments.

Figure 1E:
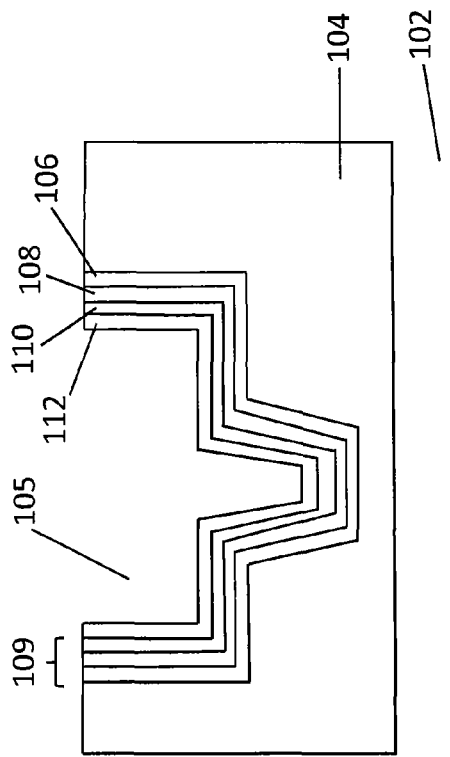

Referring back to FIG. 3, the exemplary method 300 can comprise further steps such as steps 306 and 308 in some embodiments. At step 306, a liner layer 112 is deposited over the at least one diffusion barrier material 109. The resulting structure of the exemplary semiconductor device after step 306 is illustrated in FIG. 1E.

In some embodiments, liner layer 112 comprises one or more metal elements selected from ruthenium (Ru), rhodium (Rh), hafnium (Hf), iridium (Ir), niobium (Nb), molybdenum (Mo), rhenium (Re), ruthenium (Ru), osmium (Os), tungsten (W), cobalt (Co), titanium (Ti), manganese (Mn), palladium (Pd), platinum (Pt), or silver (Ag). Examples of a suitable material for liner layer 112 include but are not limited to ruthenium (Ru) and cobalt (Co). Liner layer 112 comprises ruthenium (Ru) in some embodiments. Liner layer 112 can be formed by a deposition process including, for example, CVD, plasma enhanced CVD (PECVD), ALD, PVD, sputtering, chemical solution deposition and plating. In some embodiments, the PVD or sputtering can be performed in a vacuum chamber at a temperature in the range of 100-500° C. For example, in an exemplary process, the vacuum pressure is 15 torr and the temperature is 250° C.

At step 308, opening 105 is filled with a conductive material 114 by depositing the conductive material 114 over liner layer 112. Such conductive material 114 provides metallization lines within a layer or across layers in a semiconductor interconnect structure. The resulting structure of the exemplary semiconductor device 100 after step 308 is illustrated in FIG. 1F.

In some embodiments, conductive material 114 comprises copper (Cu), aluminum (Al), silver (Ag), gold (Au), tungsten (W), or alloys thereof. Examples of a suitable conductive material 114 include but are not limited to copper, copper alloy, aluminum, any other suitable metal, and any combination thereof. The conductive material 114 comprises copper (Cu) in some embodiments. Conductive material 114 can be formed by a process such as electric plating, chemical solution deposition, PVD, CVD, ALD and PECVD. For example, copper can be electroplated or sputtered in a vacuum chamber.

Figure 1F:
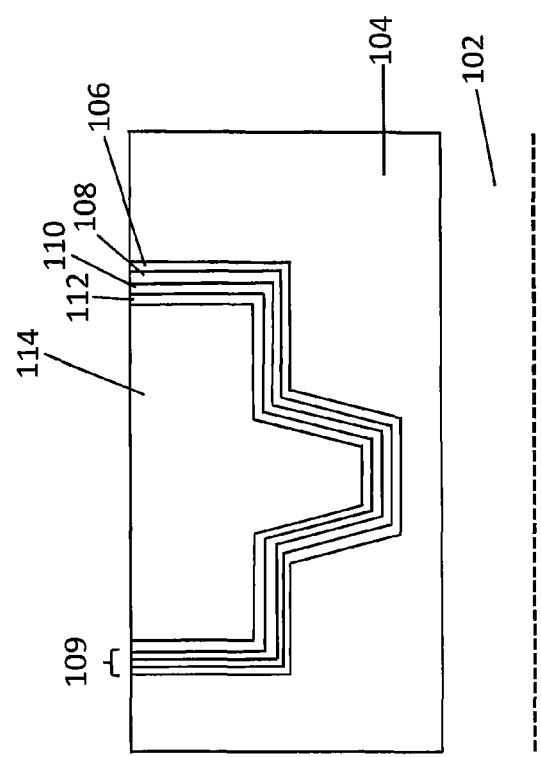
Figure 2:
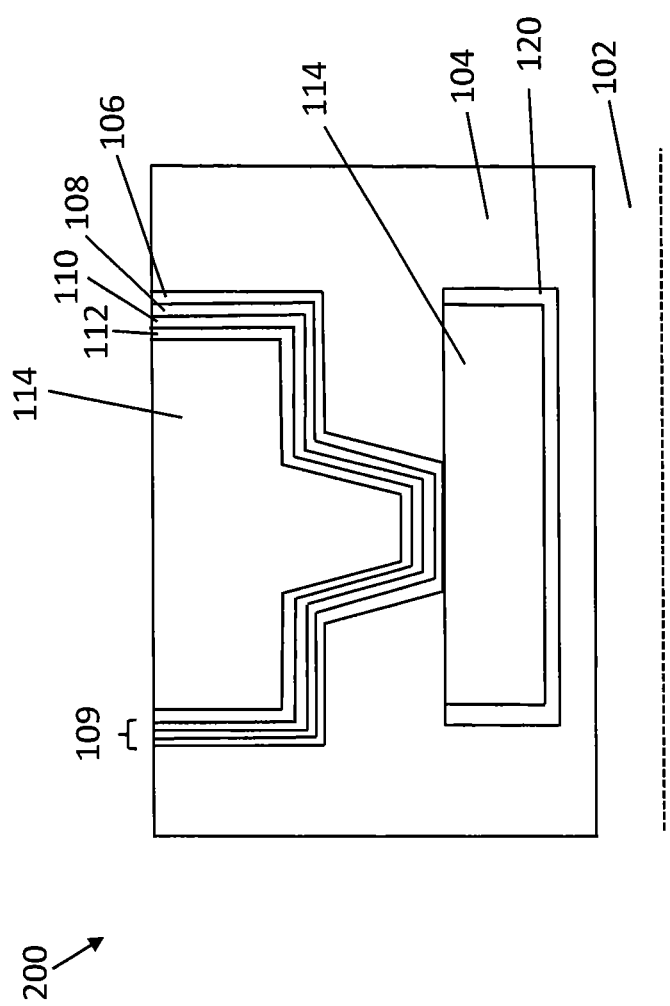
FIG. 2 illustrates an exemplary semiconductor device in accordance with some embodiments.

FIG. 1F and FIG. 2 illustrates exemplary semiconductor devices 100 and 200 in accordance with some embodiments. Semiconductor device 200 is similar to semiconductor device 100, and comprises multiple layers of interconnect structures.

As described above, semiconductor device 100 comprises: a semiconductor substrate 102; a dielectric layer 104; and a diffusion barrier layer 109. Dielectric layer 104 is disposed above semiconductor substrate 102. Diffusion barrier layer 109 is disposed over a wall of an opening 105 in dielectric layer 104. The diffusion barrier layer 109 comprises at least two alternating layers of at least one diffusion barrier material. For example, as shown in FIG. 1F, in some embodiments, diffusion barrier layer 109 comprises: at least a second layer 106 (or 110) comprising TaNx, wherein x is a number in the range of from 0.5 to 1.5, for example, in the range of from 1 to 1.5; and at least one layer 108 comprising tantalum nitride (TaN), wherein the atomic ratio of tantalum (Ta) to nitrogen (N) is substantially 1:1.

In some embodiments, device 100 or 200 further comprises a liner layer 112 and a conductive material 114. Liner layer 112 is disposed over the diffusion barrier layer 109. Conductive material 114 is disposed over liner layer 112 and filled inside the opening 105 in dielectric layer 104. Liner layer 112 comprises ruthenium (Ru), and conductive material 114 comprises copper (Cu) or copper alloy in some embodiments. In FIG. 2, an additional layer can also comprise conductive material 114 and a diffusion barrier material 120. As shown in FIG. 2, the diffusion barrier layer 109, liner layer 112 and conductive layer 114 are over another conductive material or feature 114.

The present disclosure provides a method of fabricating a semiconductor device and a resulting semiconductor device. The method of fabricating a semiconductor device comprises: forming an opening inside a dielectric layer above a semiconductor substrate. The opening has a wall. The method further comprises forming at least one diffusion barrier material over the wall of the opening by at least two alternating steps, and forming a liner layer over the at least one diffusion barrier material. The at least two alternating steps are selected from the group consisting of a process of physical vapor deposition (PVD) and a process of atomic layer deposition (ALD).

In some embodiments, the step of depositing the at least one the diffusion barrier material comprises: depositing the at least one diffusion barrier material using a PVD process; and then depositing the at least one diffusion barrier material using an ALD process. In some embodiments, the step of depositing the at least one diffusion barrier material comprises: depositing the at least one diffusion barrier material using an ALD process; and then depositing the at least one diffusion barrier material using a PVD process. In some embodiments, the step of depositing the at least one diffusion barrier material comprises, in the following sequence: depositing the at least one diffusion barrier material using an ALD process; depositing the at least one diffusion barrier material using a PVD process; and depositing the at least one diffusion barrier material using an ALD process.

The diffusion barrier layer comprises tantalum nitride in some embodiments. In each of the at least two alternating steps of depositing the at least one diffusion barrier material, the at least one diffusion barrier material is deposited in a thickness in the range of from about 5 angstroms to about 30 angstroms, for example, in the range of from about 10 angstroms to about 20 angstroms in some embodiments.

In some embodiments, the method further comprises filling the opening with a conductive material by depositing the conductive material over the liner layer. The liner layer comprises one or more metal elements selected from ruthenium (Ru), rhodium (Rh), hafnium (Hf), iridium (Ir), niobium (Nb), molybdenum (Mo), rhenium (Re), ruthenium (Ru), osmium (Os), tungsten (W), cobalt (Co), titanium (Ti), manganese (Mn), palladium (Pd), platinum (Pt), or silver (Ag). In some embodiments, the liner layer comprises ruthenium (Ru) in some embodiments. The conductive material comprises copper (Cu), aluminum (Al), silver (Ag), gold (Au), tungsten (W), or alloys thereof. The conductive material comprises copper (Cu) in some embodiments.

In some embodiments, a method of fabricating a semiconductor device in the present invention comprises: forming an opening inside a dielectric layer above a semiconductor substrate; forming at least one diffusion barrier material over the wall of the opening by at least two alternating steps selected from a process of physical vapor deposition (PVD) and a process of atomic layer deposition (ALD); forming a liner layer over the at least one diffusion barrier material; and filling the opening with a conductive material by depositing the conductive material over the liner layer. In some embodiments, the step of depositing the at least one diffusion barrier material comprises, in the following sequence: depositing the at least one diffusion barrier material using an ALD process; depositing the at least one diffusion barrier material using a PVD process; and depositing the at least one diffusion barrier material using an ALD process. In each of the at least two alternating steps of depositing the at least one diffusion barrier material, the at least one diffusion barrier material can be deposited in a thickness in the range of 10-20 angstroms. In some embodiments, the at least one diffusion barrier material comprises tantalum nitride. The liner layer comprises ruthenium (Ru), and the conductive material comprises copper (Cu).

In another aspect, the present disclosure also provides a semiconductor device, comprising: a semiconductor substrate; a dielectric layer; and a diffusion barrier layer. The dielectric layer is formed over the semiconductor substrate. The diffusion barrier layer is formed over a wall of an opening in the dielectric layer. The diffusion barrier layer comprises at least two alternating layers of at least one diffusion barrier material. For example, in some embodiments, the diffusion barrier layer comprises: at least one layer comprising tantalum nitride (TaN), wherein the atomic ratio of tantalum (Ta) to nitrogen (N) is substantially 1:1, and at least a second layer comprising TaNx, wherein x is a number in the range of from 0.5 to 1.5. The value of x is in the range of from 1 to 1.5 in some embodiments.

In some embodiments, the device further comprises a liner layer and a conductive material. The liner layer is disposed over the diffusion barrier layer. The conductive material is disposed over the liner layer and filled inside the opening in the dielectric layer. The liner layer comprises ruthenium (Ru), and the conductive material comprises copper (Cu) in some embodiments.

Although the subject matter has been described in terms of exemplary embodiments, it is not limited thereto. Rather, the appended claims should be construed broadly, to include other variants and embodiments, which may be made by those skilled in the art.

What is claimed is:

1. A method of fabricating a semiconductor device, comprising:
   forming an opening inside a dielectric layer over a substrate, the opening having a wall;
   forming at least one diffusion barrier material comprising a metal nitride over the wall of the opening by at least two alternating steps selected from the group consisting of a process of physical vapor deposition (PVD) and a process of atomic layer deposition (ALD), the at least one diffusion barrier layer comprises:
      at least one layer comprising tantalum nitride (TaN), wherein the atomic ratio of tantalum (Ta) to nitrogen (N) is substantially 1:1, and
      at least a second layer comprising TaNx, wherein x is a number in the range of from 0.5 to 1.5; and
   forming a liner layer over the at least one diffusion barrier material.

2. The method of claim 1, wherein the step of forming the at least one the diffusion barrier material comprises:
   depositing the at least one diffusion barrier material using a PVD process; and then
   depositing the at least one diffusion barrier material using an ALD process.

3. The method of claim 1, wherein the step of forming the at least one diffusion barrier material comprises:
   depositing the at least one diffusion barrier material using an ALD process; and then
   depositing the at least one diffusion barrier material using a PVD process.

4. The method of claim 1, wherein the step of forming the at least one diffusion barrier material comprises, in the following sequence:
   depositing the at least one diffusion barrier material using an ALD process;
   depositing the at least one diffusion barrier material using a PVD process; and
   depositing the at least one diffusion barrier material using an ALD process.

5. The method of claim 1, wherein the at least one diffusion barrier material comprises tantalum nitride (TaN).

6. The method of claim 1, wherein in each of the at least two alternating steps of depositing the at least one diffusion barrier material, the at least one diffusion barrier material is deposited in a thickness in the range of from about 5 angstroms to about 30 angstroms.

7. The method of claim 6, wherein in each of the at least two alternating steps of depositing the at least one diffusion barrier material, the at least one diffusion barrier material is deposited in a thickness in the range of from about 10 angstroms to about 20 angstroms.

8. The method of claim 1, further comprising:
   filling the opening with a conductive material by depositing the conductive material over the liner layer.

9. The method of claim 8, wherein the liner layer comprises one or more metal elements selected from ruthenium (Ru), rhodium (Rh), hafnium (Hf), iridium (Ir), niobium (Nb), molybdenum (Mo), rhenium (Re), ruthenium (Ru), osmium (Os), tungsten (W), cobalt (Co), titanium (Ti), manganese (Mn), palladium (Pd), platinum (Pt), or silver (Ag).

10. The method of claim 8, wherein the conductive material comprises copper (Cu), aluminum (Al), silver (Ag), gold (Au), tungsten (W), or alloys thereof.

11. The method of claim 1, wherein x is in the range of from 1 to 1.5.

12. A method of fabricating a semiconductor device, comprising:
   forming an opening inside a dielectric layer over a semiconductor substrate, the opening having a wall;
   forming at least one diffusion barrier material over the wall of the opening, wherein the step of forming the at least one diffusion barrier material comprises, in the following sequence:
      depositing the at least one diffusion barrier material using an ALD process;
      depositing the at least one diffusion barrier material using a PVD process; and
      depositing the at least one diffusion barrier material using an ALD process;
   forming a liner layer over the at least one diffusion barrier material; and
   filling the opening with a conductive material by depositing the conductive material over the liner layer.

13. The method of claim 12, wherein in each of the at least two alternating steps of depositing the at least one diffusion barrier material, the at least one diffusion barrier material is deposited in a thickness in the range of from 10 angstroms to 20 angstroms.

14. The method of claim 12, wherein the at least one diffusion barrier material comprises tantalum nitride (TaN).

15. The method of claim 12, wherein the liner layer comprises ruthenium (Ru), and the conductive material comprises copper (Cu).

16. The method of claim 12, wherein the diffusion barrier layer comprises:
- at least one layer comprising tantalum nitride (TaN), wherein the atomic ratio of tantalum (Ta) to nitrogen (N) is substantially 1:1, and
- at least a second layer comprising TaNx, wherein x is a number in the range of from 0.5 to 1.5.

17. The method of claim 16, wherein x is in the range of from 1 to 1.5.

18. A method of fabricating a semiconductor device, comprising:
- forming an opening inside a dielectric layer over a substrate, the opening having a wall;
- forming at least one diffusion barrier material over the wall of the opening, wherein the step of forming the at least one diffusion barrier material comprises, in the following sequence:
  - depositing the at least one diffusion barrier material using an ALD process;
  - depositing the at least one diffusion barrier material using a PVD process; and
  - depositing the at least one diffusion barrier material using an ALD process;
and
- forming a liner layer comprising ruthenium (Ru) over the at least one diffusion barrier material.

19. The method of claim 18, further comprising:
- filling the opening with a conductive material comprising copper by depositing the conductive material over the liner layer.

* * * * *